(12) United States Patent
Ghosh et al.

(10) Patent No.: US 12,525,446 B2
(45) Date of Patent: Jan. 13, 2026

(54) LARGE AREA GAPFILL USING VOLUMETRIC EXPANSION

(71) Applicant: Applied Materials, Inc., Santa Clara, CA (US)

(72) Inventors: Supriya Ghosh, San Jose, CA (US); Susmit Singha Roy, Sunnyvale, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 565 days.

(21) Appl. No.: 17/737,340

(22) Filed: May 5, 2022

(65) Prior Publication Data
US 2023/0360903 A1 Nov. 9, 2023

(51) Int. Cl.
*H01L 21/02* (2006.01)

(52) U.S. Cl.
CPC .. *H01L 21/02123* (2013.01); *H01L 21/02211* (2013.01); *H01L 21/0234* (2013.01); *H01L 21/02345* (2013.01)

(58) Field of Classification Search
CPC ......... H01L 21/02123; H01L 21/02211; H01L 21/0234; H01L 21/02345
See application file for complete search history.

(56) References Cited

U.S. PATENT DOCUMENTS

| 7,015,116 B1 | 3/2006 | Lo et al. |
| 2008/0160783 A1 | 7/2008 | Watanabe et al. |
| 2017/0271196 A1* | 9/2017 | Manna .............. H01L 21/76224 |

(Continued)

FOREIGN PATENT DOCUMENTS

| CN | 110739264 A | 1/2020 |
| KR | 20190141071 A | 12/2019 |
| KR | 102312824 B1 | 10/2021 |

(Continued)

OTHER PUBLICATIONS

Application No. PCT/US2023/020855, International Search Report and Written Opinion, Mailed On Aug. 23, 2023, 10 pages.

(Continued)

*Primary Examiner* — Robert S Walters, Jr.
(74) *Attorney, Agent, or Firm* — Kilpatrick Townsend & Stockton LLP

(57) ABSTRACT

Exemplary methods of semiconductor processing may include providing a silicon-containing precursor to a processing region of a semiconductor processing chamber. A substrate may be disposed within the processing region of the semiconductor processing chamber. The substrate may define one or more features along the substrate. The methods may include depositing a silicon-containing material on the substrate. The silicon-containing material may extend within the one or more features along the substrate. The methods may include providing an oxygen-containing precursor. The methods may include annealing the silicon-containing material with the oxygen-containing precursor. The annealing may cause the silicon-containing material to expand within the one or more features. The methods may include repeating one or more of the operations to iteratively fill the one or more features on the substrate.

7 Claims, 6 Drawing Sheets

(56) References Cited

U.S. PATENT DOCUMENTS

2019/0385898 A1  12/2019  Peng
2020/0279772 A1   9/2020  Roy et al.

FOREIGN PATENT DOCUMENTS

TW   201104794 A   2/2011
TW   202002077 A   1/2020

OTHER PUBLICATIONS

Search Report for Taiwan Pat. Appln. No. 112116707, 12 pages.
Taiwanese Application No. 112116707, Notice of Decision to Grant mailed on Oct. 17, 2025, 4 pages (2 pages of English Translation and 2 pages of original documents).

* cited by examiner

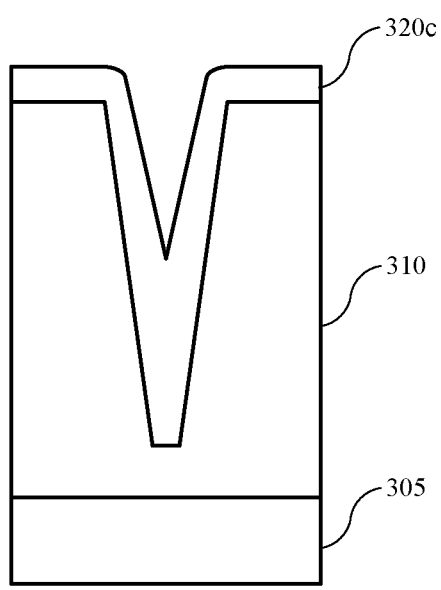 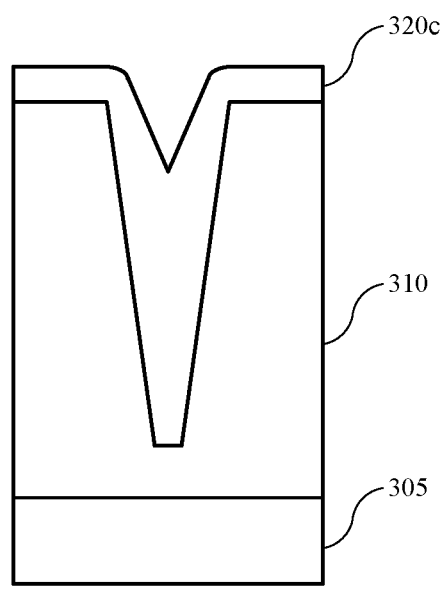
*FIG. 3E*  *FIG. 3F*

LARGE AREA GAPFILL USING VOLUMETRIC EXPANSION

TECHNICAL FIELD

The present technology relates to methods and components for semiconductor processing. More specifically, the present technology relates to systems and methods for depositing silicon-containing materials with reduced void or seam formation.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing may result in voids or seams in the materials that may result in unwanted or undesirable effects in further processing. Developing materials that can control voids or seams formation may become more difficult as device sizes continue to scale.

Thus, there is a need for improved systems and methods that can be used to produce high quality devices and structures. These and other needs are addressed by the present technology.

SUMMARY

Exemplary methods of semiconductor processing may include providing a silicon-containing precursor to a processing region of a semiconductor processing chamber. A substrate may be disposed within the processing region of the semiconductor processing chamber. The substrate may define one or more features along the substrate. The methods may include depositing a silicon-containing material on the substrate. The silicon-containing material may extend within the one or more features along the substrate. The methods may include providing an oxygen-containing precursor. The methods may include annealing the silicon-containing material with the oxygen-containing precursor. The annealing may cause the silicon-containing material to expand within the one or more features. The methods may include repeating one or more of the operations to iteratively fill the one or more features on the substrate.

In some embodiments, the one or more features along the substrate may be characterized by tapered sidewalls. The silicon-containing material deposited on the substrate may define a seam or void prior to being annealed by the oxygen-containing precursor. A temperature within the semiconductor processing chamber may be maintained at greater than or about 300° C. while depositing the silicon-containing material on the substrate. A pressure within the semiconductor processing chamber may be maintained at greater than or about 100 Torr while depositing the silicon-containing material on the substrate. Annealing the silicon-containing material may be performed at a temperature greater than or about 600° C. The annealing may be performed for a period of time of greater than or about 30 minutes.

Some embodiments of the present technology may encompass semiconductor processing methods. The methods may include providing a first silicon-containing precursor to a processing region of a semiconductor processing chamber. A substrate may be disposed within the processing region of the semiconductor processing chamber. The substrate may define one or more features along the substrate. The methods may include forming a plasma of the first silicon-containing precursor. The methods may include depositing a first silicon-containing material on the substrate. The first silicon-containing material may extend within the one or more features along the substrate. The methods may include providing a second silicon-containing precursor. The methods may include depositing a second silicon-containing material on the first silicon-containing material. The second silicon-containing material may extend within the one or more features along the substrate. The methods may include providing an oxygen-containing precursor. The methods may include annealing the second silicon-containing material with the oxygen-containing precursor. The annealing may cause the second silicon-containing material to expand within the one or more features.

In some embodiments, the first silicon-containing precursor may be or include tetraethyl orthosilicate. The second silicon-containing precursor may be or include disilane. The depositing the second silicon-containing material may be performed in a separate semiconductor processing chamber from the semiconductor processing chamber in which the first silicon-containing material is deposited. Annealing the second silicon-containing material may increase a thickness of the second silicon-containing material by greater than or about 50%. A temperature may be maintained at greater than or about 300° C. while depositing the second silicon-containing material on the substrate. Depositing the second silicon-containing material on the first silicon-containing material may be performed as a plasma-free operation. The oxygen-containing precursor may be or include steam. Annealing the second silicon-containing material may be performed at a temperature greater than or about 600° C.

Some embodiments of the present technology may encompass semiconductor processing methods. The methods may include forming a plasma of a first silicon-containing precursor. The methods may include depositing a first silicon-containing material on a substrate defining one or more features along the substrate. The first silicon-containing material may extend within the one or more features along the substrate. The methods may include providing a second silicon-containing precursor. The methods may include depositing a second silicon-containing material on the first silicon-containing material. The second silicon-containing material may extend within the one or more features along the substrate. The methods may include providing an oxygen-containing precursor. The methods may include forming a plasma of the oxygen-containing precursor. The methods may include treating the second silicon-containing material with plasma effluents of the oxygen-containing precursor. The plasma effluents of the oxygen-containing precursor may expand the second silicon-containing material on the substrate.

In some embodiments, forming the plasma of the oxygen-containing precursor may be performed at a temperature greater than or about 450° C. The plasma of the oxygen-containing precursor may be generated at a plasma power of greater than or about 800 W. The oxygen-containing precursor may be or include nitrous oxide, diatomic oxygen, or a combination of both. The first silicon-containing precursor may be or include tetraethyl orthosilicate. The second silicon-containing precursor may be or include disilane. Treating the second silicon-containing material with plasma effluents of the oxygen-containing precursor may reduce a seam or void defined in the second silicon-containing material.

Such technology may provide numerous benefits over conventional systems and techniques. For example, embodiments of the present technology may reduce the void or seam size applicable to a number of substrate features. Additionally, the present technology may produce silicon-containing films for gap filling applications, as well as any other application for which deposited films characterized by a reduced void or seam size may be a benefit. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIGS. 3A-3F show exemplary schematic cross-sectional structures in which material layers are included and produced according to some embodiments of the present technology.

Figure 1:
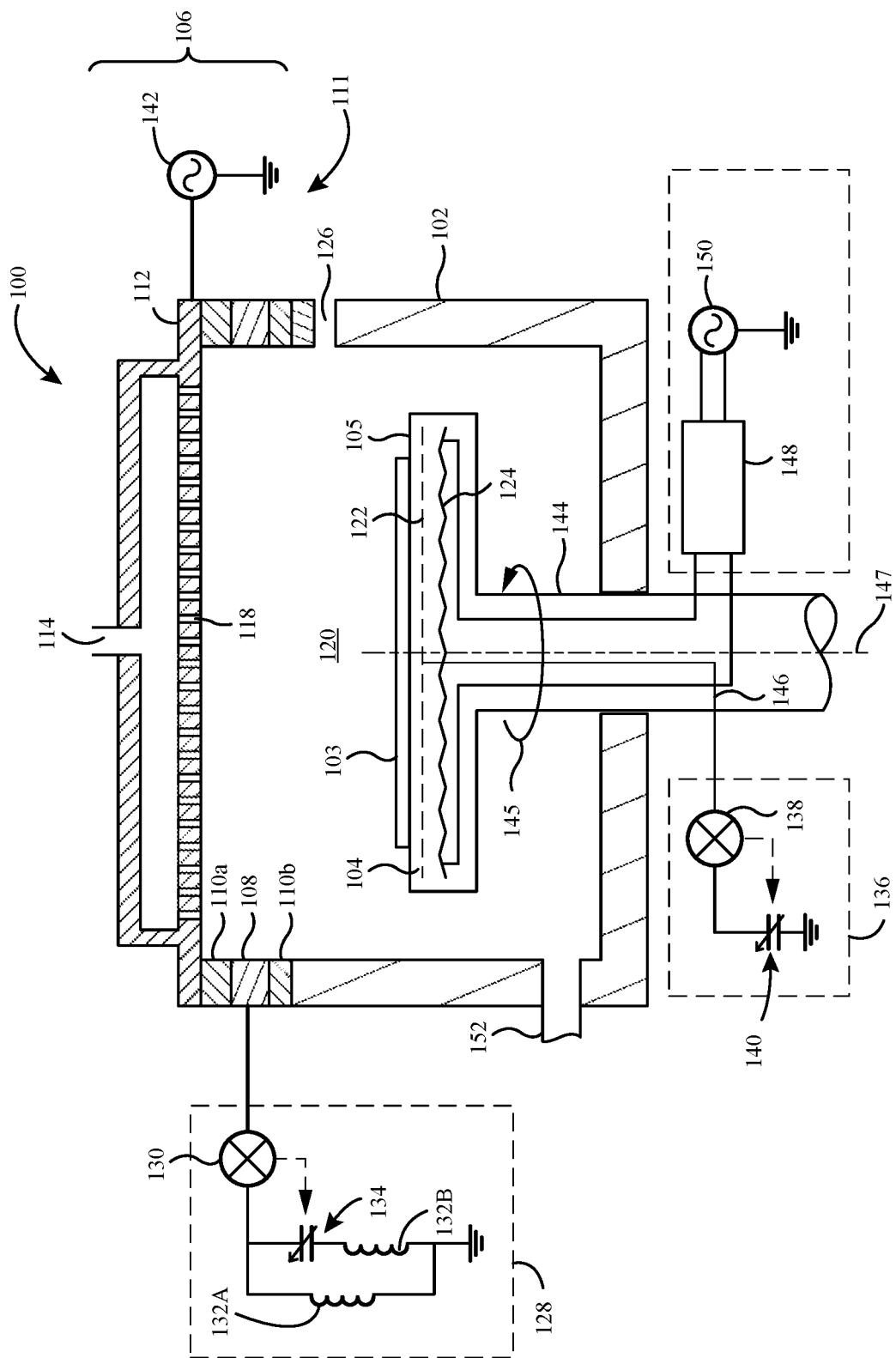
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Features across semiconductor structures may be reduced in size, and aspect ratios of the features may increase. As the aspect ratios of the features increase, chemical vapor deposition processes may produce voids or seams within the feature due to pinch off nearer the top of the feature prior to complete fill within the feature.

Conventional technologies, such as operations associated with 3D NAND, have struggled to produce films to fill high aspect ratio features in the underlying structures where void or seam formation is controlled. Deposition of silicon-containing materials on the underlying structures containing the high aspect ratio trenches may be incomplete because many silicon-containing film depositions produce conformal films. The fill operation may result in the feature sealing near the top of the feature prior to fill within the feature, which may produce a void in the fill material or a seam up the middle of the feature, which can extend to the top of the structure. In some production, where a polishing operation may subsequently occur, the removal may cause the void or seam to be exposed, which may provide access within the feature. This may allow oxidation of the material once exposed to atmosphere, as well as incorporation of slurry or other materials along the void or seam. Accordingly, many conventional technologies have been limited in the ability to prevent structural flaws in the final devices.

The present technology overcomes these issues by annealing a film on the underlying structure to reduce the presence or size of any voids or seams in the film. By annealing the film with an oxygen-containing precursor, the present technology may alter the film on the underlying structure to expand a portion of the film to reduce any void or seam in the film, which allows subsequent deposition of silicon-containing material to gradually fill the feature while minimizing the formation of a void or seam. By filling the features or high aspect ratio structure with silicon-containing material with a reduced or eliminated void or seam, the present technology may prevent problems in any following integration processes and/or defects in the final devices. Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary semiconductor processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The semiconductor processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support 104 during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the semiconductor processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the semiconductor processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the semiconductor processing chamber 100. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the semiconductor processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with the surface 105 of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the semiconductor processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the semiconductor processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support 104. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support 104 may decline. The second electronic controller 140 may have a similar effect, increasing and decreasing aerial coverage of the plasma over the substrate support 104 as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
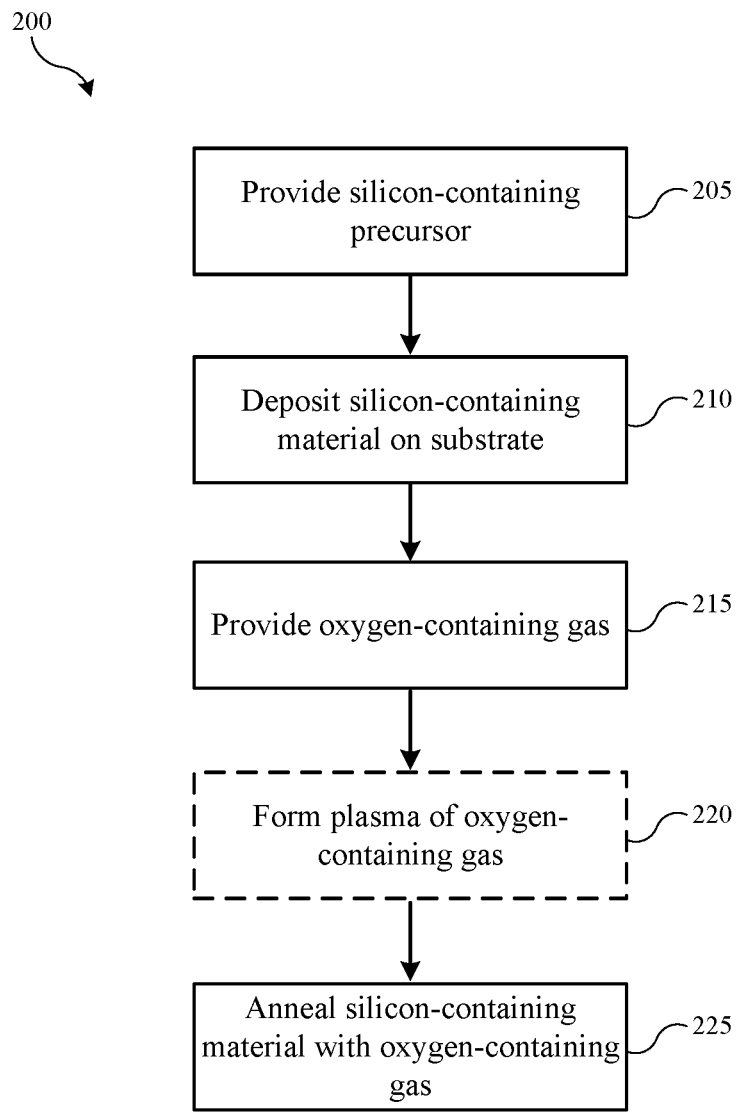
FIG. 2 shows operations in a semiconductor processing method according to some embodiments of the present technology.

FIG. 2 shows exemplary operations in a processing method 200 according to some embodiments of the present technology. The method 200 may be performed in a variety of processing chambers, including the semiconductor processing chamber 100 described above, as well as any other chambers including non-plasma chambers, in which the operations may be performed. Method 200 may include one or more operations prior to the initiation of the method 200, including front-end processing, deposition, etching, polishing, cleaning, or any other operations that may be performed prior to the described operations. The methods 200 may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 200 may describe operations shown schematically in FIGS. 3A-3F, the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3A:
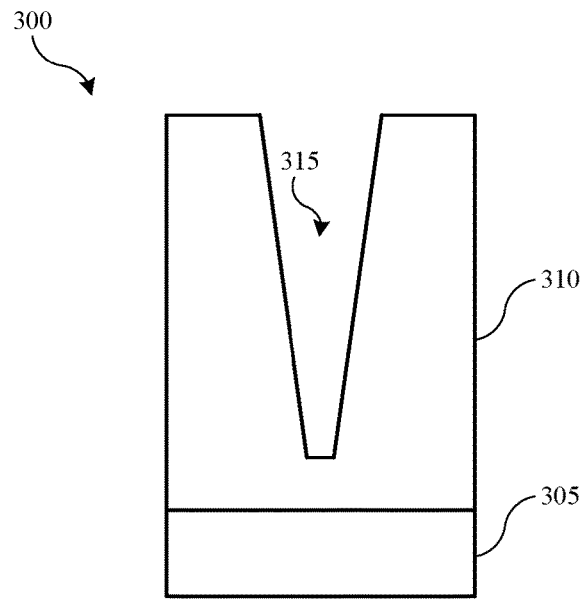

Method 200 may or may not involve optional operations to develop the semiconductor structure to a particular fabrication operation. It is to be understood that method 200 may be performed on any number of semiconductor structures or substrates 305, as illustrated in FIG. 3A, including exemplary structure 300 on which one or more silicon-containing materials may be formed. As illustrated in FIG. 3A substrate 305 may be processed to form one or more features 315, which may be recessed, such as trenches, apertures, or any other structure in semiconductor processing. Substrate 305 may be any number of materials, such as a base wafer or substrate 305 made of silicon or silicon-containing materials, other substrate 305 materials, as well as one or more materials that may be formed overlying the substrate 305 during semiconductor processing. For example, in some embodiments the substrate 305 may be processed to include one or more materials or structures for semiconductor processing. Substrate 305 may be or include a dielectric material, such as an oxide or nitride of any number of materials. In embodiments, one or more layers of material 310 may be deposited on the substrate 305. In embodiments, the one or more layers of material 310 may be or include a silicon-containing material. The silicon-containing material may be or include silicon, including amorphous silicon, doped silicon, silicon oxide, silicon nitride, or silicon carbide.

As shown, one or more features 315 may be defined by the one or more layers of material 310 and/or substrate 305, such as a trench, aperture, or other recessed feature. The features 315 may be characterized by tapered sidewalls. In embodiments, the features 315 may be characterized by a larger diameter or width at the top of the features 315 than at the bottom of the features 315. The aspect ratio of the features 315, or the ratio of the depth of the feature relative to the width or diameter of the feature formed, may be greater than or about 1:1, and may be greater than or about 2:1, than or about 3:1, greater than or about 4:1, greater than or about 5:1, greater than or about 6:1, greater than or about 7:1, greater than or about 8:1, greater than or about 9:1, greater than or about 10:1, or more. Although only one feature 315 is shown in the figure, it is to be understood that exemplary structures may have any number of features 315 defined along the structure according to embodiments of the present technology.

At operation 205, the method 200 may include providing a silicon-containing precursor to the processing region of the semiconductor processing chamber. The silicon-containing precursor may be provided to the same processing region of the semiconductor processing chamber to perform operations prior to the initiation of the method 200. Silicon-containing precursors that may be used in method 200 may be or include any number of silicon-containing precursors. For example, the silicon-containing precursor may be or include silane ($SiH_4$), dislane ($Si_2H_6$), silicon tetrachloride ($SiCl_4$), tetraethyl orthosilicate (TEOS), or any other precursor able to form, for example, a silicon oxide (SiO), a silicon nitride (SiN), or a silicon carbide (SiC) material. In some embodiments, along with the silicon-containing precursor, one or more additional precursors may be delivered, such as a hydrogen-containing precursor as well as one or more carrier or inert gases, such as argon or helium, for example. Although higher-order silanes may be used in embodiments of the present technology, and which may produce increased flowing of the deposited material, the increased hydrogen content in the material as deposited may lead to outgassing in subsequent operations.

Figure 3B:
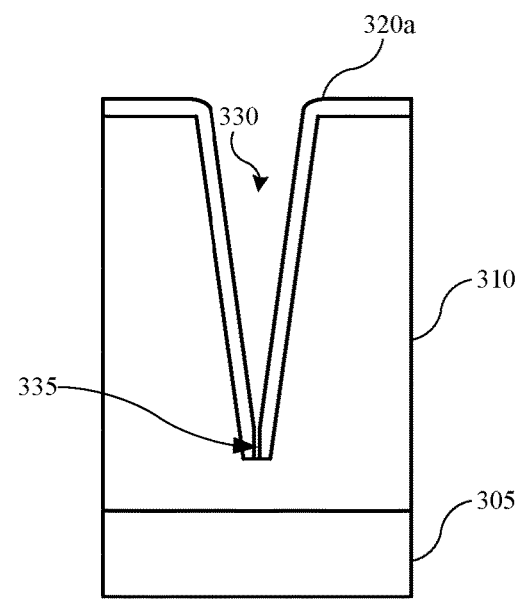

At operation 210 and as shown in FIG. 3B, the method 200 may include depositing a silicon-containing material 320a on the substrate 305 and the one or more layers of material 310 if present. The silicon-containing precursor may contact the substrate 305 and the one or more layers of material 310 if present. As illustrated in FIG. 3B, the silicon-containing material 320a may extend along any and/or all exposed surfaces along the substrate 305, when exposed, as well as any other incorporated materials, such as the one or more layers of material 310. During operation 225, growth may occur inward within the feature 315 from the sidewalls defining the feature 315.

Depositing the silicon-containing material 320a on the substrate 305 at operation 215 may be performed as a plasma-free operation. By performing operation 215 plasma-free, the deposition of the silicon-containing material 320a may be highly conformal. In embodiments, the deposition of the silicon-containing material 320a may be characterized by a conformality of greater than or about 80%, greater than or about 85%, greater than or about 90%, greater than or about 95%, or more. This high level of conformality may be beneficial during expansion of the silicon-containing material 320a in subsequent anneals, as further described below, as the silicon-containing material 320a may expand at all depths of the features 315.

As the features 315 begin to close, or fill with silicon-containing material 320a, voids 330 and/or seams 335 may be formed in the silicon-containing material 320a. The void 330 may refer to a portion in the feature 315 between the silicon-containing material 320a deposited on the bottom and top of the feature 315. Voids 330 may form due to an accumulation, or "breadloafing," of silicon-containing material 320a deposited at the top of feature 315. Seams 335 may refer to gaps, or trenches, extending into silicon-containing material 320a at or near the bottom of the feature 315. Although illustrated as a consistent opening in the figure, it is to be understood that void 330 and/or seam 335 structure may additionally be characterized by a number of shapes, which may include top-wide, bottom-wide, as well as a more amorphous shape, as would be readily understood by the skilled artisan. At longer deposition times, the amount of deposition at the top of the feature 315 may begin to close off the feature 315 entirely such that the void 330 or seam 335 is formed and is covered by silicon-containing material 320a. At longer time periods, voids 330 or seams 335 may no longer be filled with silicon-containing material 320a. The present technology may incorporate one or more anneal treatments to expand the silicon-containing material 320a to reduce or eliminate any voids 330 and/or seams 335.

During the above deposition, the semiconductor processing chamber, the pedestal, or the substrate 305 may be maintained at a variety of temperatures at which film depositions may be performed. In some embodiments the temperature of the semiconductor processing chamber, the pedestal, or the substrate 305 may be maintained at less than or about 700° C., less than or about 650° C., less than or about 600° C., less than or about 550° C., less than or about 500° C., or less. In embodiments, the temperature of the semiconductor processing chamber, the pedestal, or the substrate 305 may be maintained at greater than or about 300° C., greater than or about 350° C., greater than or about 400° C., greater than or about 450° C., greater than or about 500° C., or more, which may facilitate thermal decomposition of the precursors, allowing the plasma-free deposition to be performed.

Also during the above deposition, the semiconductor processing chamber may be maintained at a variety of pressures at which depositions may be performed. For example, a pressure within the semiconductor processing chamber may be maintained at greater than or about 100 Torr while depositing the silicon-containing materials 320a, and may be maintained at greater than or about 150 Torr, greater than or about 200 Torr, greater than or about 250 Torr, greater than or about 300 Torr, greater than or about 350 Torr, greater than or about 400 Torr, or more. Similarly, the a pressure within the semiconductor processing chamber may be maintained at less than or about 500 Torr while depositing the silicon-containing materials 320a, and may be maintained at less than or about 450 Torr, less than or about 400 Torr, less than or about 350 Torr, less than or about 300 Torr, less than or about 250 Torr, less than or about 200 Torr, or less.

At operation 215, subsequent to depositing the silicon-containing material 320a, the method 200 may include providing an oxygen-containing precursor. In some embodiments, the method 200 may include halting a flow of the silicon-containing precursor prior to operation 215. Halting the flow of the silicon-containing precursor may stop deposition, allowing treatment, such as an anneal, of the deposited film to be performed. The oxygen-containing precursor may be provided to the same processing region of the semiconductor processing chamber to deposit the silicon-containing material 320a, and may be continued from the deposition(s) operation as noted above. In other embodiments, the structure 300 may be moved to a different chamber prior to operation 215. Oxygen-containing precursors that may be used in method 200 may be or include any number of oxygen-containing precursors. For example, the oxygen-containing precursor may be or include nitrous oxide ($N_2O$), water ($H_2O$), diatomic oxygen ($O_2$), ozone ($O_3$), a combination of one or more of these, or any other oxygen-containing materials.

In some embodiments, the method 200 may include forming a plasma of the oxygen-containing precursor at operation 220. Plasma power may impact the depth of oxygen penetration, may reduce the temperature needed to expand the silicon-containing material 320a, and/or may increase the amount of void 330 and/or seam 335 removal that may occur. Accordingly, in some embodiments the plasma power applied when generating the plasma of the oxygen-containing precursor may be greater than or about 800 W, greater than or about 850 W, greater than or about 900 W, greater than or about 1,000 W, or more. However, at higher plasma power the bombardment may increase and may cause sputtering and/or etching of the silicon-containing material 320a, and thus, in some embodiments, the plasma power may be less than or about 1,500 W, less than or about 1,400 W, less than or about 1,300 W, less than or about 1,200 W, less than or about 1,000 W, or less. While forming the plasma of the oxygen-containing precursor, a temperature within the semiconductor processing chamber may be maintained at greater than or about 450° C., and may be maintained at greater than or about 500° C., greater than or about 550° C., greater than or about 600° C., or more. The temperature may be maintained at less than or about 650° C. while forming the plasma of the oxygen-containing precursor, and may be maintained at less than or about 600° C., less than or about 550° C., less than or about 500° C., or less. In embodiments where the plasma of the oxygen-containing precursor is formed, the oxygen-containing precursor may include a one or both of $N_2O$ and $O_2$.

Figure 3C:
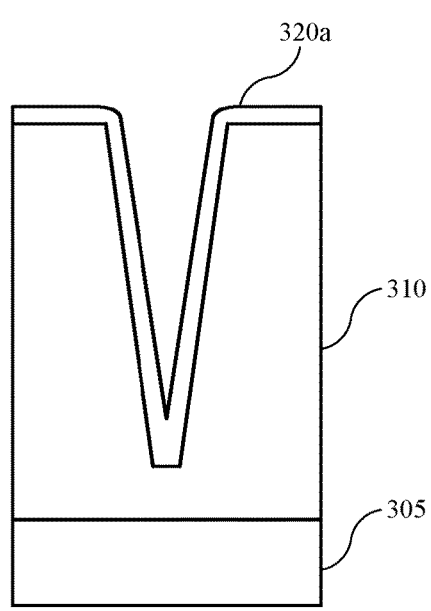

At operation 225 and as illustrated in FIG. 3C, the method 200 may include annealing the silicon-containing material 320a with the oxygen-containing precursor, or with plasma effluents of the oxygen-containing precursor. As previously discussed, when depositing the silicon-containing material 320a, voids 330 and/or seams 335 may form in the silicon-containing material 320a due to increased sidewall deposition that may close inward that may seal off the feature 315 prior to completely filling the feature 315. In order to reduce or remove these voids 330 or seams 335, the present technology may expand the silicon-containing material 320a by annealing the film. The oxygen-containing precursor, or the plasma effluents of the oxygen-containing precursor when formed, may cause the silicon-containing material 320a to expand inward from the sidewalls of the features 315 due to incorporation of oxygen into the silicon-containing material 320a.

The annealing may cause the silicon-containing material 320a to expand within the one or more features 315. When the silicon-containing material 320a expands within the features 315, the material may expand in all directions across the feature 315 and reduce any unfilled space between the silicon-containing material 320a deposited on the sidewalls of the feature 315. Without being bound by any particular theory, during annealing, the silicon-containing material 320a may expand inward and may bond across the feature 315 during the expansion and annealing. Thus, treating the silicon-containing material 320a with the oxygen-containing precursor, such as with plasma effluents of the oxygen-containing precursor, may reduce any void 330 or seam 335 defined in the silicon-containing material 320a.

During operation 225, temperature may be increased compared to temperatures used during the previous deposition operations. A temperature within the semiconductor processing chamber in which the anneal may be performed may be maintained at greater than or about 600° C. while annealing the silicon-containing material 320a, and may be maintained at greater than or about 650° C., greater than or about 700° C., greater than or about 750° C., greater than or about 800° C., greater than or about 850° C., greater than or about 900° C., or more. However, at greater temperatures, the substrate 305 and/or the one or more layers of material 310 if present, may also be affected by the anneal. For example, in embodiments using a substrate 305 that is or includes silicon, the substrate 305 may begin to oxidize as well. Accordingly, the temperature within the semiconductor processing chamber may be maintained at less than or about 1,000° C. while annealing the silicon-containing material 320a, and may be maintained at less than or about 950° C., less than or about 900° C., less than or about 850° C., less than or about 800° C., less than or about 750° C., less than or about 700° C., or less. In embodiments where the silicon-containing material 320a is treated with plasma effluents of the oxygen-containing precursor, the temperature to perform the anneal and expand the silicon-containing material 320a may be less than the temperature for thermally-induced oxidation. In such embodiments, the temperature within the semiconductor processing chamber may be maintained at less than or about 600° C. while annealing the silicon-containing material 320a, and may be maintained at less than or about 575° C., less than or about 550° C., or less.

Annealing the silicon-containing material 320a with the oxygen-containing precursor, or plasma effluents of the oxygen-containing precursor if present, at operation 225 may continue for a sufficient time to expand the silicon-containing material 320a in the feature 315 a desired amount. The time may be dependent on various factors including, but not limited to, depth of the feature 315, aspect ratio of the feature 315, and/or a thickness of the silicon-containing material 320a. In some embodiments, the annealing may be performed for a period of time of greater than or about 30 minutes, and may be greater than or about 45 minutes, greater than or about 60 minutes, greater than or about 75 minutes, greater than or about 90 minutes, greater than or about 105 minutes, greater than or about 120 minutes, greater than or about 150 minutes, greater than or about 180 minutes, greater than or about 210 minutes, greater than or about 240 minutes, or greater. At longer periods of time, the treatment of the silicon-containing material 320a with the oxygen-containing precursor, or plasma effluents of the oxygen-containing precursor if present, may cause increased expansion of the silicon-containing material 320a. Accordingly, in some embodiments the treatment may be performed for less than or about 180 minutes, less than or about 150 minutes, less than or about 120 minutes, or less.

During operation 225, a thickness of the silicon-containing material 320a may be increased dependent on how long the silicon-containing material 320a is annealed. This may be due, at least in part, to incorporation of oxygen into the film and conversion of the silicon film to a silicon oxide film. At shorter annealing treatments, the thickness that the silicon-containing material 320a is increased may be lesser. At longer annealing treatments, the thickness that the silicon-containing material 320a is increased may be greater. In embodiments, annealing the silicon-containing material 320a may increase the thickness of the silicon-containing material 320a by greater than or about 50%, and may increase the thickness of the silicon-containing material 320a by greater than or about 60%, greater than or about 70%, greater than or about 80%, greater than or about 90%, greater than or about 100%, greater than or about 110%, or more. Annealing the silicon-containing material 320a may increase the thickness of the silicon-containing material 320a by less than or about 120%, and may increase the thickness of the silicon-containing material 320a by less than or about 110%, less than or about 100%, or less.

Figure 3D:
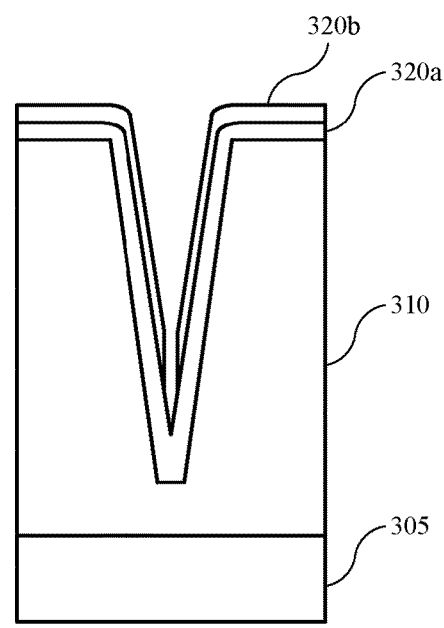

As illustrated in FIGS. 3D-3E, in order to fill the features 315 while reducing or eliminating the voids 330 and/or seams 335, the method 200 may include sequentially depositing silicon-containing material, such as an additional silicon-containing material 320b, followed by annealing the additional silicon-containing material 320b with the oxygen-containing precursor. After annealing, the additional silicon-containing material 320b may be combined and be consistent with the previously annealed silicon-containing material 320a to form a combined silicon-containing material 320c. This process may be repeated for any number of cycles. As shown in FIG. 3F, when cycling the deposition and annealing of silicon-containing material, the one or more features 315 may iteratively fill higher in a bottom-up gapfill, such as towards the top of the feature 315, during each deposition and annealing sequence. As previously discussed, annealing the silicon-containing material 320b with the oxygen-containing precursor, or plasma effluents of the oxygen-containing precursor, may expand the silicon-containing material 320b. By repeatedly depositing and annealing silicon-containing material, the material may expand and voids 330 and/or seams 335 may be reduced or eliminated entirely.

The number of iterations of sequentially depositing film and annealing the film may be dependent on a variety of factors including, but not limited to, the depth of the features 315, the aspect ratio of the features 315, amount of silicon-containing material deposited, and/or the presence of voids 330 and/or seams 335 in the silicon-containing material. In some embodiments, the method 200 of depositing the silicon-containing material and annealing the silicon-containing material may be repeated at least two times, and may include depositing and annealing the silicon-containing material at least three times, at least four times, at least five times, at least six times, at least seven times, or more.

In embodiments where the silicon-containing material 320 is repeatedly deposited in the features 315 and subsequently annealed, earlier films may be expanded larger than later films. This may be due to a lesser thickness of the films subsequently deposited in the features 315 to control the expansion. Furthermore, as previously discussed, the one or more features 315 along the substrate 305 may be characterized by tapered sidewalls. Due to the conformal depositions previously described, this sidewall profile may challenge gapfill with eliminated voids 330 and/or seams 335. However, the present technology may be able to overcome any number of topographies and/or feature geometries to produce reduced void space or void-free filling.

Figure 4:
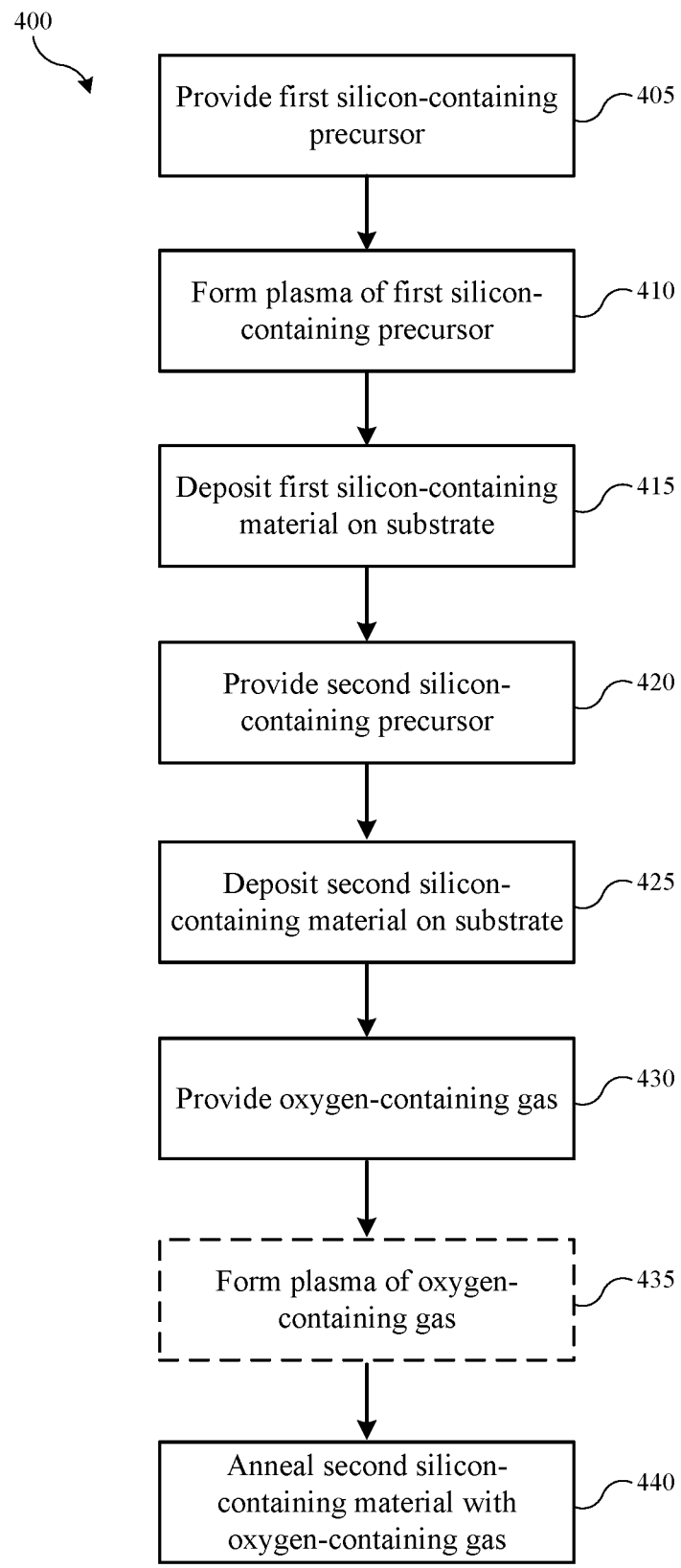
FIG. 4 shows operations in a semiconductor processing method according to some embodiments of the present technology.

Some embodiments of the present technology may also afford uncycled filling, which may improve throughput. FIG. 4 shows exemplary operations in a processing method 400 according to some embodiments of the present technology. The method 400 may be performed in a variety of processing chambers, including the semiconductor processing chamber 100 described above, as well as any other chambers including non-plasma chambers, in which the operations may be performed. Method 400 may include any of the aspects, materials, or characteristics of method 200 as described above. The methods 400 may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 400 may describe operations shown schematically in FIGS. 5A-5D, the illustrations of which will be described in conjunction with the operations of method 400. It is to be understood that the figures illustrate only partial schematic views, and a substrate may contain any number of additional materials and features having a variety of characteristics and aspects as illustrated in the figures.

Figure 5A:
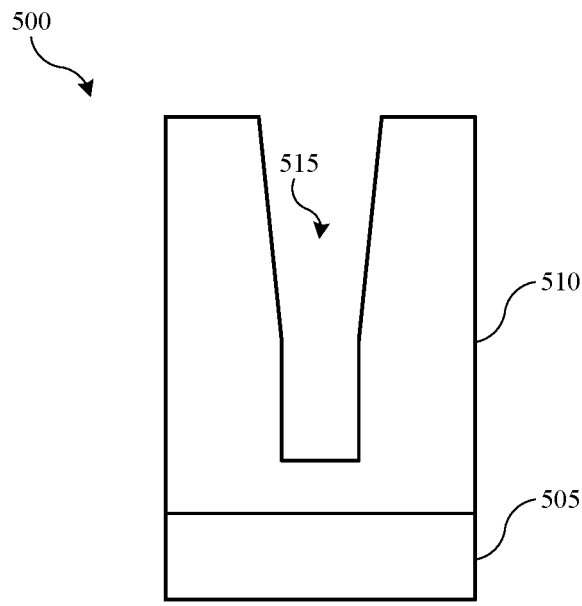
FIGS. 5A-5D show exemplary schematic cross-sectional structures in which material layers are included and produced according to some embodiments of the present technology.

Method 400 may or may not involve optional operations to develop the semiconductor structure to a particular fabrication operation. It is to be understood that method 400 may be performed on any number of semiconductor structures or substrates 505, as illustrated in FIG. 5A, including exemplary structure 500 on which one or more silicon-containing materials may be formed. Substrate 505 may have any aspects, qualities, or characteristics as described with regard to substrate 305. Substrate 505 may also have features 515 similar to features 315 described with regard to substrate 305.

In embodiments, a first silicon-containing material may be deposited prior to depositing the silicon-containing material that may undergo volumetric expansion. For example, a first silicon oxide material may be formed within the feature to a first thickness, followed by silicon oxide formation as discussed above, which may afford a final filling operation that may produce a reduced void or void-free fill. At operation 405, the method 400 may include providing a first silicon-containing precursor to the processing region of a semiconductor processing chamber, such as semiconductor processing chamber 100, where the substrate 505 may be housed. In some embodiments, an oxygen-containing precursor may be provided with the silicon-containing precursor. The semiconductor processing chamber may be the same or a different chamber from the chamber in which a pre-treatment or earlier processing operation may be performed. The first silicon-containing precursor may be or include any of the silicon-containing precursors discussed previously with regard to operation 205 of method 200, as well as any of the oxygen-containing precursors discussed above. In some embodiments, a silicon-and-oxygen containing precursor may be used as the first silicon-containing precursor, and may be or include, for example, TEOS.

At operation 410, the method 400 may include forming a plasma of the first silicon-containing precursor, which may also include forming plasma of an oxygen-containing precursor or other deposition precursor, if included. Plasma power may impact the depth of silicon penetration, the extent of bond reorientation, and/or the amount of voids 530 and/or seams 535 formation that may subsequently occur. Accordingly, in some embodiments the plasma power applied when generating the plasma of silicon-containing precursor, such as the first plasma power applied in method 400, may be less than or about 2,000 W, and may be less than or about 1,500 W, less than or about 1,250 W, less than or about 1,000 W, less than or about 750 W, less than or about 500 W, less than or about 250 W, or less. However, at lower plasma power the plasma effluents of the silicon-containing precursor may not as readily reach the full depth of the features 515, and thus, in some embodiments, the plasma power may be greater than or about 250 W, greater than or about 500 W, greater than or about 750 W, greater than or about 1,000 W, or more.

Figure 5B:
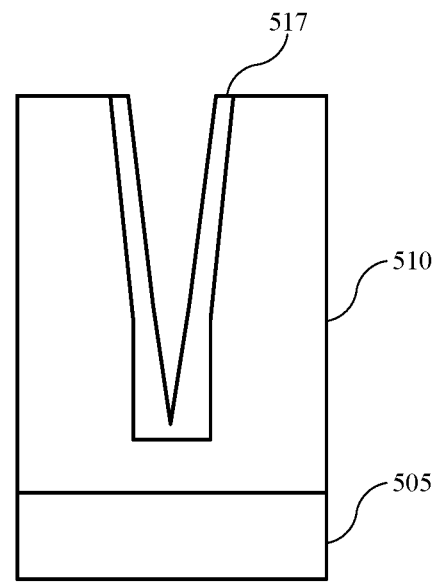

At operation 415 and as shown in FIG. 5B, the method 400 may include depositing a first silicon-containing material 517 on the substrate 505 and/or one or more layers of material 510. In some embodiments, the film deposited may be the film sought for gapfilling, such as silicon oxide, as one non-limiting example. Plasma effluents of the first silicon-containing precursor may contact the substrate 505, as well the one or more layers of material 510 if present. As illustrated in FIG. 5B, the first silicon-containing material 520 may extend along any and/or all exposed surfaces along the substrate 505, when exposed, as well as any other incorporated materials, such as the one or more layers of material 510. During operation 415, growth may occur inward within the feature 515 from the sidewalls defining the feature 515. The first silicon-containing material 517 may be a silicon or silicon-containing film, and in some embodiments the first silicon-containing material may be a silicon-and-oxygen containing film.

The deposition of the first silicon-containing material 517 may be substantially conformal, and thus, growth may occur inward within the feature 515 from the sidewalls defining the feature 515 where the rate of growth inward from the sidewalls may be less than or equal to the rate of growth at the bottom and top of the feature 515. The amount of deposition may vary based on the amount of time the deposition of the first silicon-containing material 517 is performed. While the amount of deposition may vary, during the deposition at operation 415, a greater amount of the first silicon-containing material 517 may be deposited at the bottom of the features 515 than at the top of the features 515. Additionally, in some embodiments, a greater amount of the first silicon-containing material 517 may be deposited at the bottom and/or top of the features 515 than at the sidewalls defining the features 515.

The deposition of the first silicon-containing material may be performed to fill a feature a certain amount, to reduce or limit iterations of deposition of a second silicon-containing material. For example, in some embodiments the first silicon-containing material may be deposited to fill greater than or about 10% of a width or diameter of a feature being filled, and may be deposited to fill greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, greater than or about 65%, greater than or about 70%, greater than or about 75%, greater than or about 80%, or more. However, as the amount of deposition increases, the likelihood of void formation from pinch-off may increase. Accordingly, to help maintain access to the feature, the first silicon-containing material may be deposited to fill less than or about 85% of the width or diameter of the feature being filled, and may be deposited to fill less than or about 80%, less than or about 75%, less than or about 70%, less than or about 65%, less than or about 60%, less than or about 55%, less than or about 50%, or less.

Figure 5C:
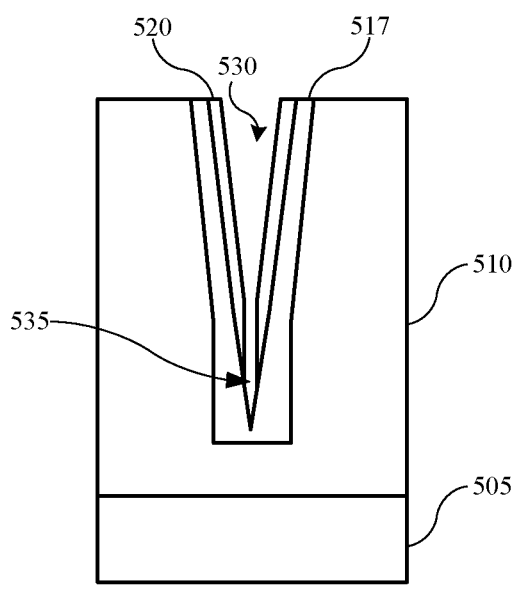

At operation 420, the method 400 may include providing a second silicon-containing precursor to a processing region of a second semiconductor processing chamber. The structure 500 may be moved to a different semiconductor processing chamber prior to operation 420. In other embodiments, the second silicon-containing precursor may be provided to the same processing region of the semiconductor processing chamber to deposit the first silicon-containing material 517, and may be continued from the deposition operation as noted above. In embodiments, the first silicon-containing precursor may be or include TEOS, as previously discussed, and the second silicon-containing precursor may be or include $Si_2H_6$, although any silicon-containing material as previously noted may be used in embodiments of the present technology. At operation 425 and as shown in FIG. 5C, the method 400 may include depositing a second silicon-containing material 520 on the substrate 505, the one or more layers of material 510 if present, and/or the first silicon-containing material 517. The second silicon-containing precursor may contact the substrate 505, the one or more layers of material 510 if present, and/or the first silicon-containing material 517. As illustrated in FIG. 5C, the second silicon-containing material 520 may extend along any and/or all exposed surfaces along the substrate 505, when exposed, as well as any other incorporated materials, such as the one or more layers of material 510 and/or the first silicon-containing material 517. The second-silicon containing precursor and the second silicon-containing material 520 may share any qualities, characteristics, or features as the silicon-containing material 320 previously described with regard to method 200.

Although operation 415 may include a plasma-enhanced deposition, depositing the second silicon-containing material 525 on the substrate 505, or on the first silicon-containing material 517, at operation 425 may be performed as a plasma-free operation. By performing operation 425 plasma-free, the deposition of the second silicon-containing material 520 may be highly conformal. In embodiments, the deposition of the second silicon-containing material 520 may be characterized by a conformality of greater than or about 80%, greater than or about 85%, greater than or about 90%, greater than or about 95%, or more. This high level of conformality may be beneficial during expansion of the second silicon-containing material 520 in subsequent anneals, as further described below, as the second silicon-containing material 520 may expand at all depths of the features 515. Similar to method 200, as the features 515 begin to close, or fill with silicon-containing material 520, voids 530 and/or seams 535 may be formed in the silicon-containing material 520.

During the above depositions, the semiconductor processing chamber, the pedestal, or the substrate 505 may be maintained temperatures as described above with regard to method 200. Similarly, the semiconductor processing chamber may be maintained at pressures as described above with regard to method 200. Based on the amount of the first silicon-containing material deposited in the feature, the second silicon-containing material may be deposited to afford a single expansion operation, although multiple cycles may be performed as previously described. For example, the second-silicon-containing material may be deposited to a thickness of less than, greater than, or about 50% of the remaining width or diameter of the feature to be filled after deposition of the first silicon-containing material to any of the thicknesses discussed above relative to a feature size.

Figure 5D:
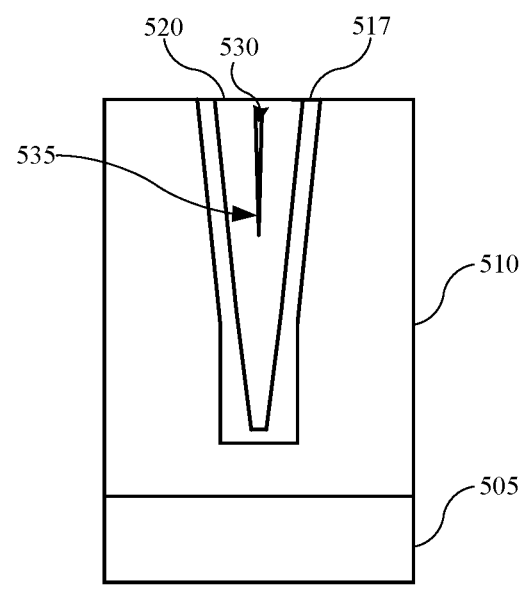

At operation 430, subsequent to depositing the silicon-containing material 520, the method 400 may include providing an oxygen-containing precursor to the second processing region of the second semiconductor processing chamber to treat the silicon-containing material 520. In some embodiments, the method 400 may include forming a plasma of the oxygen-containing precursor at operation 435. At operation 440 and as illustrated in FIG. 5D, the method 400 may include annealing the silicon-containing material 520 with the oxygen-containing precursor, or with plasma effluents of the oxygen-containing precursor. Treating the silicon-containing material 520 may be similar to and share any characteristics as operations 215-225 describe above with regard to method 200.

In embodiments where the silicon-containing material is deposited and annealed only once, some voids 530 and/or seams 535 may remain in the features 515 based on the extent of expansion throughout the feature, and the amount of material deposited. However, in such embodiments, the presence of voids 530 and/or seams 535 may still be reduced compared to conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a silicon-containing precursor" includes a plurality of such precursors, and reference to "the silicon-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a first silicon-containing precursor to a processing region of a semiconductor processing chamber, wherein a substrate is disposed within the processing region of the semiconductor processing chamber, and wherein the substrate defines one or more features along the substrate;
forming a plasma of the first silicon-containing precursor;
depositing a first silicon-containing material on the substrate, wherein the first silicon-containing material extends within the one or more features along the substrate;
providing a second silicon-containing precursor;
depositing a second silicon-containing material on the first silicon-containing material, wherein the second silicon-containing material extends within the one or more features along the substrate;
providing an oxygen-containing precursor; and
annealing the second silicon-containing material with the oxygen-containing precursor, wherein the annealing causes the second silicon-containing material to expand within the one or more features, and wherein, after annealing, the one or more features are filled with the first silicon-containing material and the second-silicon containing material without any voids.

2. The semiconductor processing method of claim 1, wherein:
the first silicon-containing precursor comprises tetraethyl orthosilicate, and wherein the second silicon-containing precursor comprises disilane.

3. The semiconductor processing method of claim 1, wherein:
the depositing the second silicon-containing material is performed in a separate semiconductor processing chamber from the semiconductor processing chamber in which the first silicon-containing material is deposited.

4. The semiconductor processing method of claim 1, wherein:
annealing the second silicon-containing material increases a thickness of the second silicon-containing material by greater than or about 50%.

5. The semiconductor processing method of claim 1, wherein:
a temperature is maintained at greater than or about 300° C. while depositing the second silicon-containing material on the substrate.

6. The semiconductor processing method of claim 5, wherein:
depositing the second silicon-containing material on the first silicon-containing material is performed as a plasma-free operation.

7. The semiconductor processing method of claim 5, wherein:
the oxygen-containing precursor comprises steam; and
annealing the second silicon-containing material is performed at a temperature greater than or about 600° C.

* * * * *